(12) United States Patent
Pal

(10) Patent No.: US 10,057,974 B2
(45) Date of Patent: Aug. 21, 2018

(54) INTEGRATED PANEL LEVEL LIQUID COOLING FOR BUS BARS

(71) Applicant: Hamilton Sundstrand Corporation, Charlotte, NC (US)

(72) Inventor: Debabrata Pal, Hoffman Estates, IL (US)

(73) Assignee: HAMILTON SUNDSTRAND CORPORATION, Charlotte, NC (US)

( * ) Notice: Subject to any disclaimer, the term of this patent is extended or adjusted under 35 U.S.C. 154(b) by 0 days.

(21) Appl. No.: 15/343,512

(22) Filed: Nov. 4, 2016

(65) Prior Publication Data

US 2018/0132343 A1  May 10, 2018

(51) Int. Cl.
| | | |
|---|---|---|
| *H05K 1/02* | (2006.01) | |
| *H01H 1/62* | (2006.01) | |
| *H05K 7/20* | (2006.01) | |
| *H02G 5/08* | (2006.01) | |
| *H05K 1/18* | (2006.01) | |
| *H05K 3/30* | (2006.01) | |

(52) U.S. Cl.
CPC ............ *H05K 1/0203* (2013.01); *H01H 1/62* (2013.01); *H02G 5/08* (2013.01); *H05K 1/181* (2013.01); *H05K 3/303* (2013.01); *H05K 7/20254* (2013.01); *H05K 2201/10053* (2013.01); *H05K 2201/10272* (2013.01); *H05K 2201/10295* (2013.01); *H05K 2201/10409* (2013.01)

(58) Field of Classification Search
CPC ...... H05K 1/0203; H05K 1/181; H05K 3/303; H05K 7/20254; H05K 2201/10053; H05K 2201/10272; H05K 2201/10295; H05K 2201/10409; H01H 1/62

See application file for complete search history.

(56) References Cited

U.S. PATENT DOCUMENTS

| | | | |
|---|---|---|---|
| 9,137,925 B2 | 9/2015 | Pal et al. | |
| 9,142,364 B2 | 9/2015 | Pal | |
| 2006/0040527 A1 | 2/2006 | Shirota | |
| 2014/0035118 A1* | 2/2014 | Bayerer | ................ H01L 23/049 257/690 |

(Continued)

FOREIGN PATENT DOCUMENTS

| | | |
|---|---|---|
| EP | 2680289 A1 | 1/2014 |
| EP | 2712040 A1 | 3/2014 |

OTHER PUBLICATIONS

Extended European Search Report for Applicatiuon No. 17198847.0; Report dated Mar. 26, 2018; Report Received Date: Mar. 26, 2018; 1-9 pages.

*Primary Examiner* — Hoa C Nguyen
(74) *Attorney, Agent, or Firm* — Cantor Colburn LLP

(57) ABSTRACT

An electrical contactor assembly is provided including: an electrical contactor; an electrical bus bar; a panel; at least one post protruding through the panel and in contact with the electrical bus bar, the post being constructed from an electrically and thermally conductive material, wherein a first end of the at least one post is configured to electrically and thermally connect to the electrical contactor; and a liquid cooled heat sink thermally connected to a second end of the at least one post through the electrical bus bar, wherein the liquid cooled heat sink in operation circulates liquid coolant through the liquid cooled heat sink to absorb heat.

17 Claims, 4 Drawing Sheets

(56) References Cited

U.S. PATENT DOCUMENTS

| | | | |
|---|---|---|---|
| 2014/0087584 A1* | 3/2014 | Pal | H02B 1/056 |
| | | | 439/485 |
| 2016/0014916 A1* | 1/2016 | Ausserlechner | G01R 31/2884 |
| | | | 361/699 |
| 2016/0242312 A1* | 8/2016 | Singh | H05K 1/111 |

\* cited by examiner

INTEGRATED PANEL LEVEL LIQUID COOLING FOR BUS BARS

BACKGROUND

The subject matter disclosed herein generally relates to the field of electrical contactors and, more particularly, to an electrical contactor mounting assembly which is capable of dissipating heat.

Contactor assemblies are used in electrical applications, such as aircraft power distribution systems, where power and current flow control of a multi-phase power distribution system is required. A contactor assembly typically has a panel on which several electrical contactors are mounted. Known mounting assemblies used to mount electrical contactors to the panels are constructed of thermally and electrically resistive materials, such as plastics.

Each of the contactors is connected to an electrical bus bar, and allows current to flow through the contactor and the corresponding bus bar whenever the contactor is in a closed position. The electrical power and current flow through the contactors is controlled by mechanically actuating a contact plate within the contactor such that, when current flow is desired to pass through the contactor, the contact plate is pushed into electrical contact with two leads and forms an electrical path coupling the leads, thereby allowing current to flow through it. Due to the amount of current traveling from the leads to the connector, waste heat is generated at the contact points and should be removed in order to prevent heat buildup. Additional factors such as imperfections in the contact surfaces of other imperfections can add to the amount of waste heat generated.

To dissipate the waste heat, previous known contactor mounting assemblies use thermally conductive electrical connections to allow the heat from the contact to be transmitted to the bus bars connected to each of the contactor's leads. The bus bars then dissipate heat into the atmosphere using natural convection and radiation techniques.

SUMMARY

According to one embodiment, an electrical contactor assembly is provided. The electrical contactor assembly including: an electrical contactor; an electrical bus bar; a panel; at least one post protruding through the panel and in contact with the electrical bus bar, the post being constructed from an electrically and thermally conductive material, wherein a first end of the at least one post is configured to electrically and thermally connect to the electrical contactor; and a liquid cooled heat sink thermally connected to a second end of the at least one post through the electrical bus bar, wherein the liquid cooled heat sink in operation circulates liquid coolant through the liquid cooled heat sink to absorb heat.

In addition to one or more of the features described above, or as an alternative, further embodiments of the electrical contactor assembly may include that the liquid cooled heat sink is interposed between the panel and the electrical bus bar.

In addition to one or more of the features described above, or as an alternative, further embodiments of the electrical contactor assembly may include a panel insulator interposed between the electrical bus bar and the liquid cooled heat sink, the panel insulator being constructed from a thermally conductive and electrically insulating material.

In addition to one or more of the features described above, or as an alternative, further embodiments of the electrical contactor assembly may include that the liquid cooled heat sink is composed of a plurality of parallel coolant flow channels.

In addition to one or more of the features described above, or as an alternative, further embodiments of the electrical contactor assembly may include that the contactor assembly includes a plurality of posts, the second end of each of the plurality of posts being thermally connected to liquid cooled heat sink through the electrical bus bar.

In addition to one or more of the features described above, or as an alternative, further embodiments of the electrical contactor assembly may include that the panel is a printed wire board having a plurality of conductive element embedded in one or more layers of the panel.

In addition to one or more of the features described above, or as an alternative, further embodiments of the electrical contactor assembly may include a structural support configured to mechanically fasten the at least one post to the panel.

According to another embodiment, an electrical panel box assembly is provided. The electrical panel box assembly including: a plurality of electrical contactors; a plurality of electrical bus bars; a single panel; a plurality of posts protruding through the panel and in contact with the plurality of electrical bus bars, each of the plurality of posts being constructed from an electrically and thermally conductive material, wherein a first end of each of the plurality of posts is configured to electrically and thermally connect to an electrical contactor; and a liquid cooled heat sink thermally connected to a second end of each of the plurality of posts through the electrical bus bar, wherein the liquid cooled heat sink in operation circulates liquid coolant through the liquid cooled heat sink to absorb heat.

In addition to one or more of the features described above, or as an alternative, further embodiments of the electrical panel box assembly may include that the liquid cooled heat sink is interposed between the panel and each of the plurality of electrical bus bars.

In addition to one or more of the features described above, or as an alternative, further embodiments of the electrical panel box assembly may include a plurality of panel insulators interposed between each electrical bus bar and the liquid cooled heat sink, the panel insulator being constructed from a thermally conductive and electrically insulating material.

In addition to one or more of the features described above, or as an alternative, further embodiments of the electrical panel box assembly may include that the liquid cooled heat sink is composed of a plurality of parallel coolant flow channels.

In addition to one or more of the features described above, or as an alternative, further embodiments of the electrical panel box assembly may include that the panel is a printed wire board having a plurality of conductive element embedded in one or more layers of the panel.

In addition to one or more of the features described above, or as an alternative, further embodiments of the electrical panel box assembly may include a plurality of structural supports configured to mechanically fasten each of the plurality of posts to the panel.

According to another embodiment, a method of assembling an electrical contactor assembly is provided. The method includes: obtaining a post having a first end and a second end, the post being constructed from an electrically and thermally conductive material; operably connecting the first end of the post to an electrical contactor, wherein a first end of the post is configured to electrically and thermally connect to the electrical contactor; inserting the second end of the post through a hole in a panel; operably connecting an electrical bus bar to the second end of the post; and thermally connecting a liquid cooled heat sink to the second end of the post through the electrical bus bar, wherein the liquid cooled heat sink in operation circulates liquid coolant through the liquid cooled heat sink to absorb heat.

In addition to one or more of the features described above, or as an alternative, further embodiments of the method may include that the liquid cooled heat sink is interposed between the panel and the electrical bus bar.

In addition to one or more of the features described above, or as an alternative, further embodiments of the method may include inserting a panel insulator interposed between the electrical bus bar and the liquid cooled heat sink, the panel insulator being constructed from a thermally conductive and electrically insulating material.

In addition to one or more of the features described above, or as an alternative, further embodiments of the method may include that the liquid cooled heat sink is composed of a plurality of parallel coolant flow channels.

In addition to one or more of the features described above, or as an alternative, further embodiments of the method may include that the contactor assembly includes a plurality of posts, the second end of each of the plurality of posts being thermally connected to liquid cooled heat sink through the electrical bus bar.

In addition to one or more of the features described above, or as an alternative, further embodiments of the method may include that the panel is a printed wire board having a plurality of conductive element embedded in one or more layers of the panel.

In addition to one or more of the features described above, or as an alternative, further embodiments of the method may include mechanically fastening the post to the panel using a structural support.

Technical effects of embodiments of the present disclosure include utilizing a liquid cooled heat sink to cool electrical contactor.

The foregoing features and elements may be combined in various combinations without exclusivity, unless expressly indicated otherwise. These features and elements as well as the operation thereof will become more apparent in light of the following description and the accompanying drawings. It should be understood, however, that the following description and drawings are intended to be illustrative and explanatory in nature and non-limiting.

BRIEF DESCRIPTION

The following descriptions should not be considered limiting in any way. With reference to the accompanying drawings, like elements are numbered alike:

The detailed description explains embodiments of the present disclosure, together with advantages and features, by way of example with reference to the drawings.

DETAILED DESCRIPTION

A detailed description of one or more embodiments of the disclosed apparatus and method are presented herein by way of exemplification and not limitation with reference to the Figures.

Figure 1:
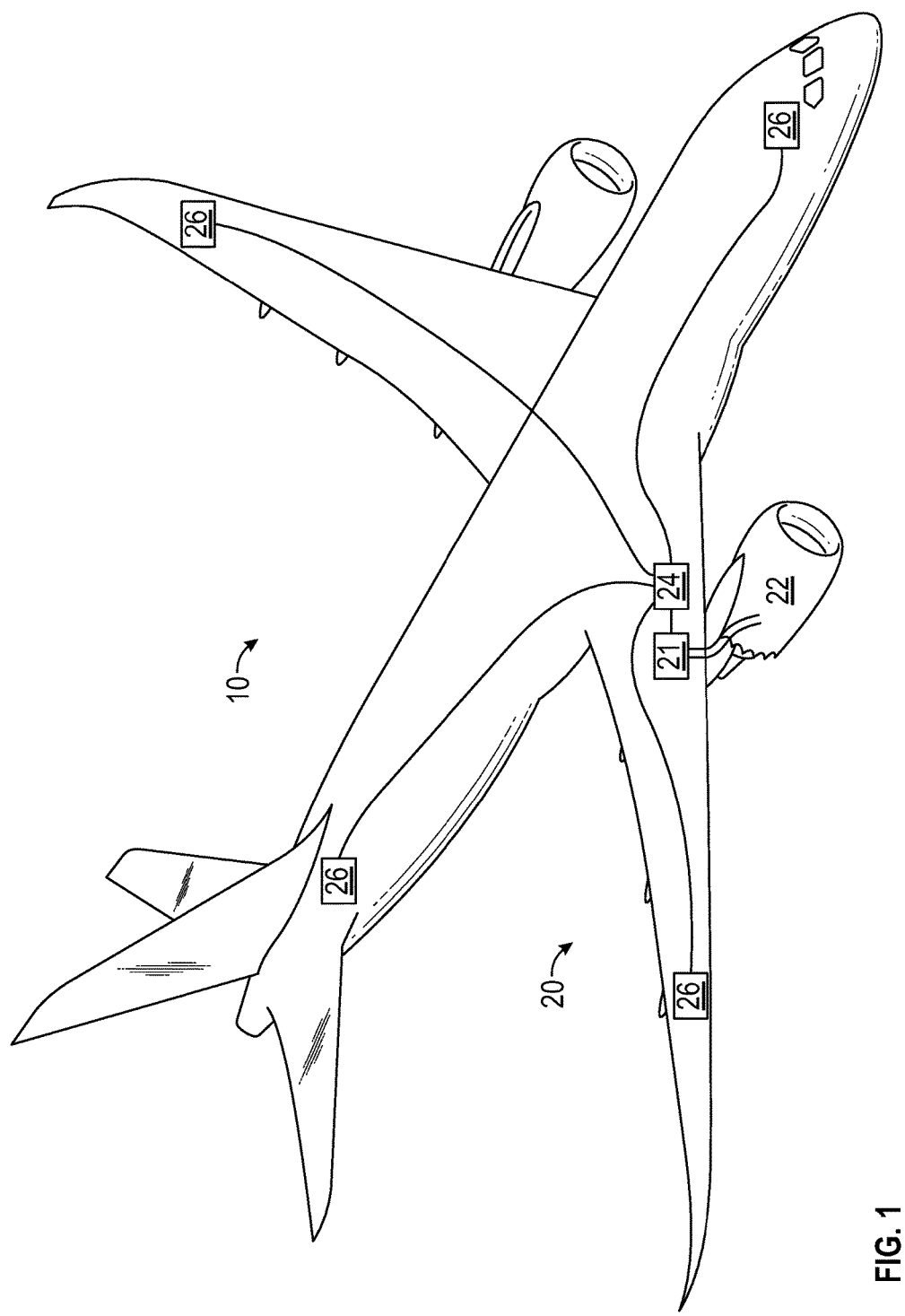
FIG. 1 is a schematic diagram of an aircraft that may incorporate embodiments of the present disclosure.

Referring now to FIG. 1, an aircraft 10 including an electrical power distribution system 20 is illustrated. The aircraft 10 includes a power generation system 21, which utilizes rotation within the jet engines 22 to generate either single phase or three phase electrical power. The power is sent to a panel box 24 that contains multiple electrical buses and contactor assemblies 100 (shown in FIG. 3) for controlling how the power is distributed throughout the aircraft 10. Through the use of the electrical contactor assemblies, power may be controlled for each onboard electrical system 26 independently.

Figure 2:
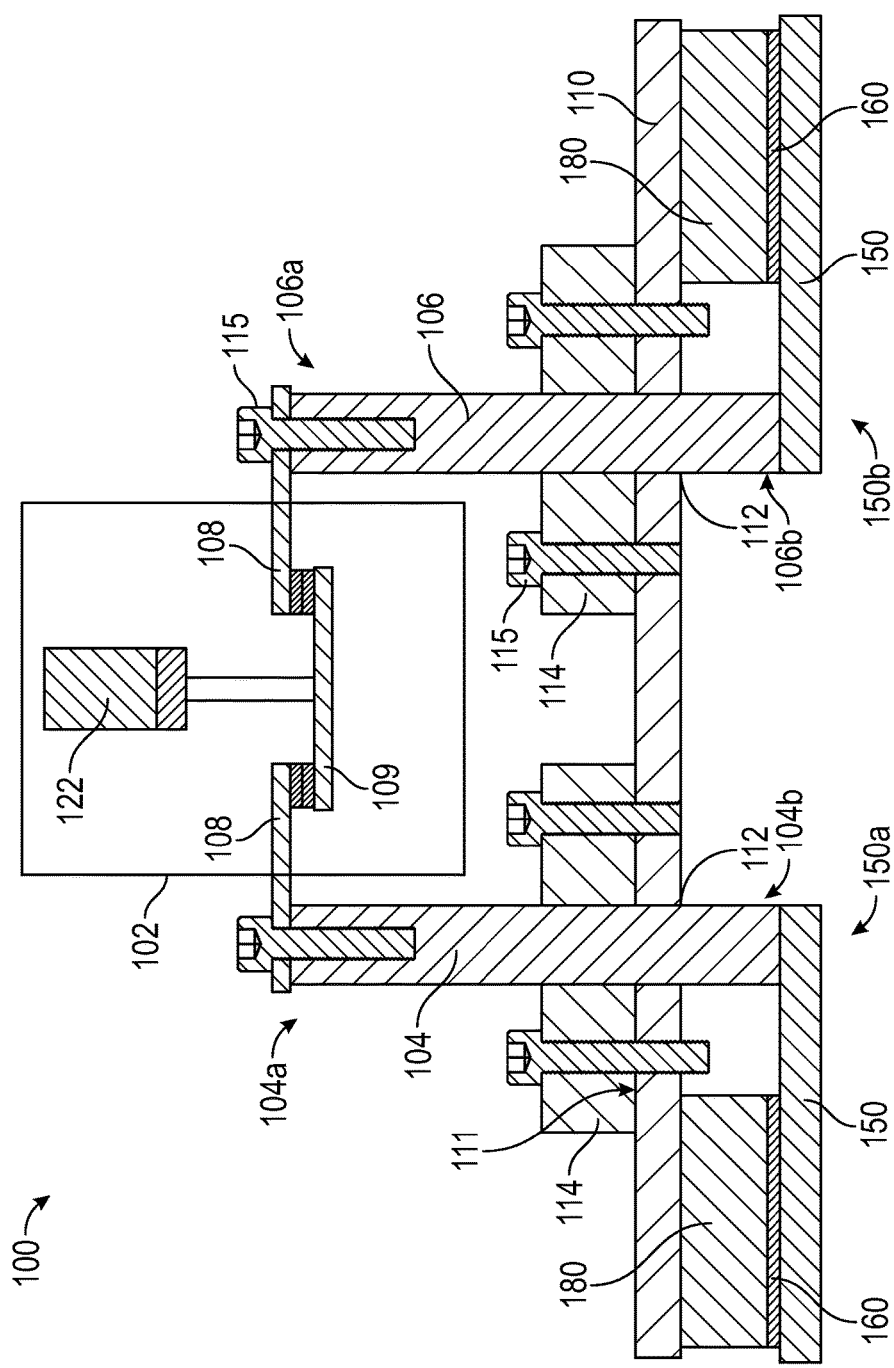
FIG. 2 is a cross-sectional view of a contactor assemblies, according to an embodiment of the present disclosure.
Figure 3:
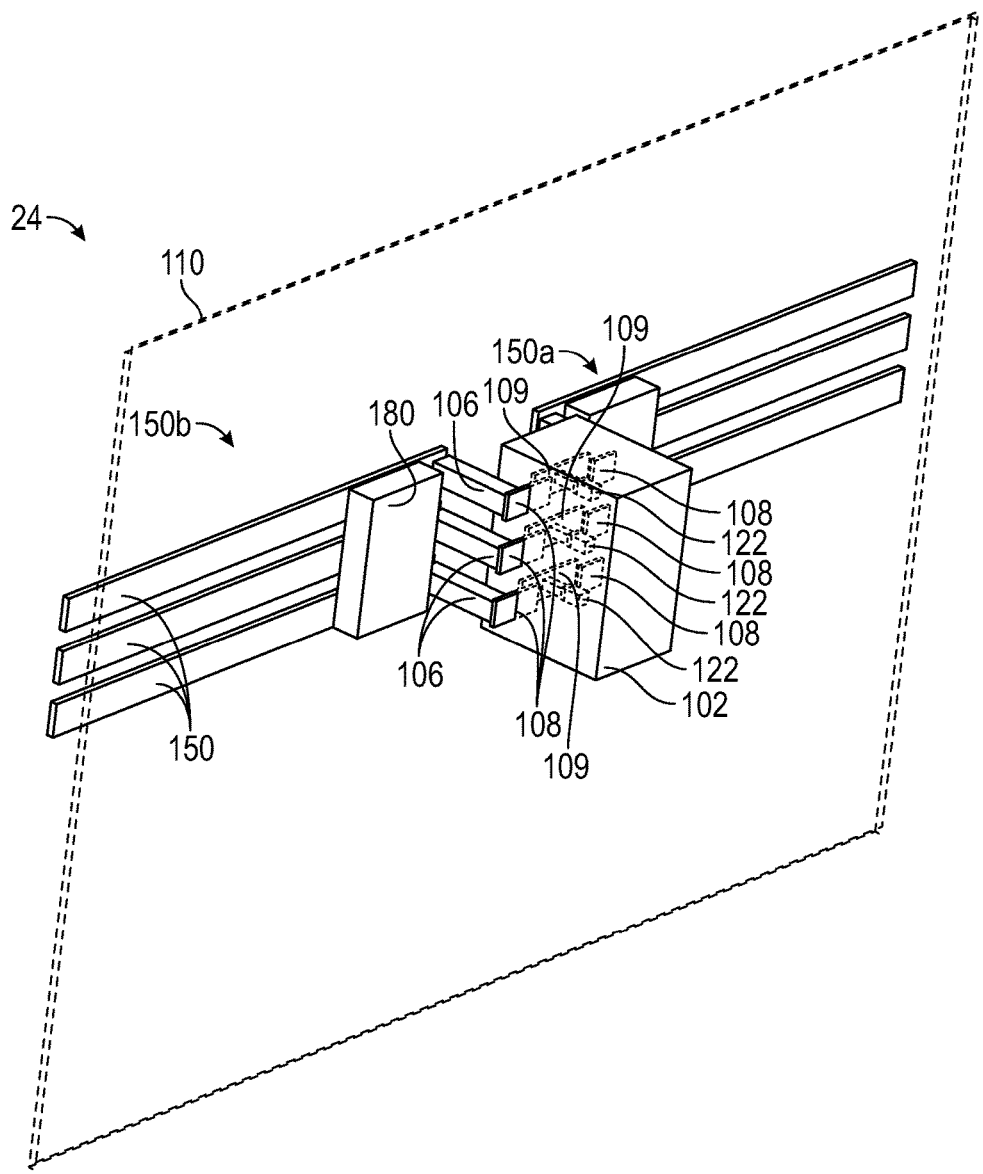
FIG. 3 is an isometric view of electrical panel box assembly incorporating multiple contactor assemblies of FIG. 2, according to an embodiment of the present disclosure.
Figure 4:
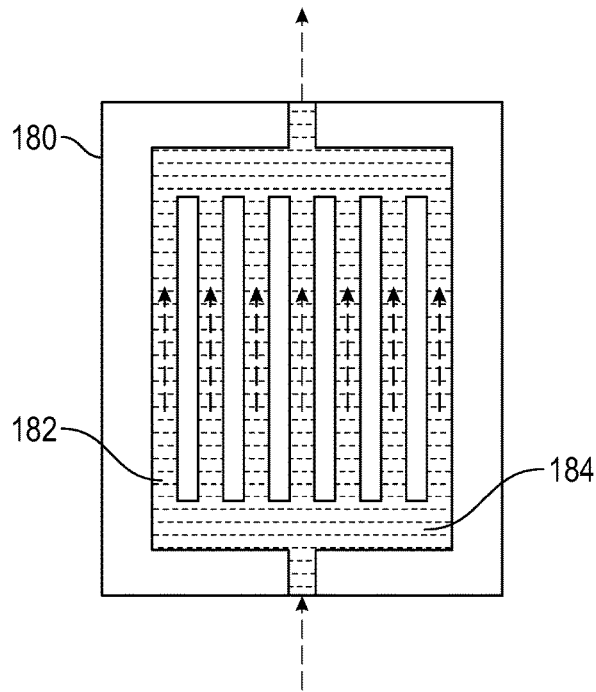
FIG. 4 is a schematic cross-sectional illustration of a liquid cooled heat sink, according to an embodiment of the present disclosure.

Referring now to FIGS. 2-4, a contactor assembly 100 that includes an electrical contactor 102 is operably connected to at least one bus bar 150 is illustrated. The contactor assembly 100 includes one or more posts 104 for connecting an electrical contactor 102 to a first side 150a of a bus bar 150 and one or more posts 106 for connecting the electrical contactor 102 to a second side 150b of a bus bar 150. The posts 104, 106 have a first end 104a, 106a and a second end 104b, 106b. The second end 104b, 106b of the post 104, 106 is operably connected to the bus bar 150. The electrical contactor 102 is operably connected to the first end 104a, 106a of the posts 104, 106 of the connector assembly 100 via a set of electrical leads 108 using known thermal and electrical connection techniques. In one embodiment, fasteners 115, such as screws for example, operably connect the leads 108 to the first ends 104a, 106a. The posts 104, 106 are electrically and thermally connected to the bus bar 150. In an embodiment, the posts 104, 106 are constructed from an electrically and thermally conductive material. The electrical power and current flow through the electrical contactor 102 is controlled by mechanically actuating a contact plate 109 within the electrical contactor 102 such that, when current flow is desired to pass through the electrical contactor 102, the contact plate 109 is pushed into electrical contact with two leads 108 and forms an electrical path coupling the leads 108, thereby allowing current to flow through it. The contact plate 109 may be actuated by a motor 122, as seen in FIG. 2

The contactor assembly 100 also includes a panel 110 having multiple holes 112 through which the posts 104, 106 extend. In one embodiment, the posts 104, 106 are in direct contact with the panel 110. A structural support 114, formed integrally with each of the posts 104, 106, is positioned at the interface between the posts 104, 106 and the panel 110 to mechanically fasten each post 104, 106 to the panel 110. In one embodiment, fasteners 115, such as screws for example, connect the structural support 114 to the panel 110. A heat sink insulator 111 may be interposed between the structural support 114 and the panel 110. The electrical resistivity of the heat sink insulator 111 prevents electrical current from bleeding into the panel 110. In one embodiment, because the panel 110 is electrically resistive, the heat sink insulator 111 is not needed in the contactor assembly 100. The heat sink insulator 111 may allow heat to be thermally transferred into the panel 110 and subsequently into a liquid cooled heat sink 180, as further described below. The heat sink insulator 111 may be constructed from a thermally conductive and electrically insulating material, such as, for example, aluminum nitride, SILPAD K10, Bergquist 5000S35, and Lord SC 320.

In one embodiment, the panel 110 is electrically resistive and thermally conductive. In such an embodiment, the panel 110 may be constructed of a thermally conductive polymer such as CoolPoly®, for example. In another embodiment, illustrated in FIG. 4, the panel 110 may be a printed wire board having one or more layers carrying a conductive material embedded thereon. The conductive material may be formed, for example, of copper. The number of layers and the material of the layers included in the panel 110 will vary with each application based on the amount of heat to be dissipated.

The thermal conductivity of the posts 104, 106 allow heat to transfer from the electrical contactor 102 to the panel 110. Once in the panel 110, the heat conducts through the panel 110 and dissipates into the surrounding air using radiation and convection in the same manner as the heat being dissipated by the bus bar 150 in known systems. The panel 110 has a significantly larger surface area exposed to the ambient atmosphere than the bus bar 150, such that more heat is dissipated into the atmosphere, resulting in a higher heat generation tolerance for the electrical contactor 102.

As illustrated in FIG. 2, the contactor assembly 100 also includes a liquid cooled heat sink 180 As also seen in FIG. 2, the liquid cooled heat sink 180 may be interposed between the panel 110 and the bus bar 150, thus allowing the liquid cooled heat sink 180 to absorb heat from both the panel 110 and the bus bar 150. The liquid cooled heat sink 180 utilizes a liquid coolant 184 within the liquid cooled heat sink 180 to absorb heat. There may be a liquid cooled heat sink 180 on the first side 150a of the bus bar 150 and a liquid cooled heat sink 180 on the second side 150b of the bus bar 150. In an embodiment, the liquid cooled heat sink 180 on the first side 150a is the same as liquid cooled heat sink on the second side 150 and is part of one continuous liquid coolant flow. The liquid cooled heat sink 180 is thermally connected to the second end 104b, 106b of the posts 104, 106 through the bus bar 150. In an embodiment, as seen in FIG. 2, a panel insulator 160 may interposed between the electrical bus bar 150 and the liquid cooled heat sink 180. The panel insulator 160 may be constructed from a thermally conductive and electrically insulating material, such as, for example, aluminum nitride, SILPAD K10, Bergquist 5000S35, and Lord SC 320. Thus, the panel insulator 160 allows heat to be transferred from the bus bar 150 to the liquid cooled heat sink 180, while restricting the electrical flow from the bus bar 150 to the liquid cooled heat sink 180. Heat from the electrical contactor 102 is transferred from the electrical leads 108 of the connector 102 through the posts 104, 106, then through the bus bar 150 and into the liquid cooled heat sink 180. In an embodiment, as seen in FIG. 4, the liquid cooled heat sink 180 may be composed of a plurality of parallel coolant flow channels 182. In FIG. 4, the liquid cooled heat sink 180 is composed of seven parallel coolant flow channels 182. In an embodiment, multiple contactors 102 may connect to a single liquid cooled heat sink 180, as seen in the electrical panel box assembly 24 of FIG. 3. In another embodiment, a single liquid cooled heat sink 180 may provide cooling to both the first side 150a and the second side 150b of the bus bar 150.

Advantageously, the liquid cooled heat sink 180 allows for an increased rate of heat dissipation away from the electrical contactor 102, thereby increasing the cooling efficiency of the contactor assembly 100. Also advantageously, because the contactor assembly 100 more efficiently dissipates heat using the liquid cooled heat sink 180, the bus bar 150 may be reduced to the size required to transfer electrical current to a load and need not be sized to also dissipate heat. Thus, by improving the heat dissipation of the contactor assembly 100 using the liquid cooled heat sink 180, the size and weight, and therefore the cost of the contactor assembly 100 are all reduced.

Figure 5:
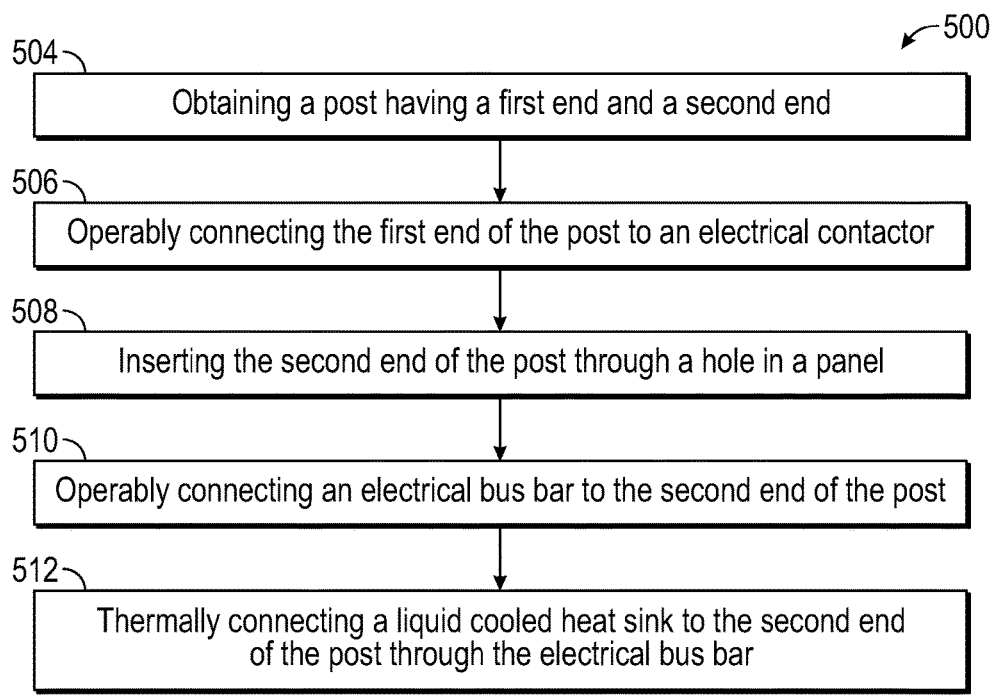
FIG. 5 is a flow process illustrating a method of assembling the contactor assembly of FIGS. 1-4, according to an embodiment of the present disclosure.

Referring now to FIG. 5, while referencing components of the contactor assembly 100 of FIGS. 1-4, FIG. 5 shows a flow process illustrating a method 500 of assembling the contactor assembly 100 of FIGS. 1-4, according to an embodiment of the present disclosure. At block 504, a post 104, 106 having a first end 104a, 106a and a second end 104b, 106b is obtained. As described above, in an embodiment, the post 104, 106 may be constructed from an electrically and thermally conductive material. At block 506, the first end 104a, 106a of the post 104, 106 is operably connected to an electrical contactor 102. As described above, the first end 104a, 106a of the post 104, 106 is configured to electrically and thermally connect to the electrical contactor 102. At block 508, the second end 104b, 106b of the post 104, 106 is inserted through a hole 112 in a panel 110. As mentioned above, in an embodiment, the panel 110 may be formed from an electrically insulating material. At block 510, the electrical bus bar 150 is operably connected to the second end 104b, 106b of the post 104, 106. At block 512, a liquid cooled heat sink 180 is thermally connected to the second end 104b, 106b of the post 104, 106 through the electrical bus bar 150. The liquid cooled heat sink 180 in operation circulates liquid coolant 184 through the liquid cooled heat sink 180 to absorb heat from the electrical contactor 102. The method 500 may also include, inserting a panel insulator 160 interposed between the electrical bus bar 150 and the liquid cooled heat sink 180. As mentioned above, the panel insulator 160 may be constructed from a thermally conductive and electrically insulating material. The method 500 may further include, mechanically fastening the post 104, 106 to the panel 110 using a structural support 114.

While the above description has described the flow process of FIG. 5 in a particular order, it should be appreciated that unless otherwise specifically required in the attached claims that the ordering of the steps may be varied.

The term "about" is intended to include the degree of error associated with measurement of the particular quantity based upon the equipment available at the time of filing the application. For example, "about" can include a range of ±8% or 5%, or 2% of a given value.

The terminology used herein is for the purpose of describing particular embodiments only and is not intended to be limiting of the present disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

While the present disclosure has been described with reference to an exemplary embodiment or embodiments, it will be understood by those skilled in the art that various changes may be made and equivalents may be substituted for elements thereof without departing from the scope of the present disclosure. In addition, many modifications may be made to adapt a particular situation or material to the teachings of the present disclosure without departing from the essential scope thereof. Therefore, it is intended that the present disclosure not be limited to the particular embodiment disclosed as the best mode contemplated for carrying out this present disclosure, but that the present disclosure will include all embodiments falling within the scope of the claims.

What is claimed is:

1. An electrical contactor assembly comprising:
an electrical contactor;
an electrical bus bar being constructed from a thermally conductive material;
a panel being constructed from a thermally conductive material;
at least one post protruding through the panel and in contact with the electrical bus bar, the post being constructed from an electrically and thermally conductive material, wherein a first end of the at least one post is configured to electrically and thermally connect to the electrical contactor; and
a liquid cooled heat sink thermally connected to a second end of the at least one post through the electrical bus bar, wherein the liquid cooled heat sink in operation circulates liquid coolant through the liquid cooled heat sink to absorb heat,
wherein the liquid cooled heat sink is interposed between the panel and the electrical bus bar, and
wherein the liquid cooled heat sink is thermally connected to the panel and the electrical bus bar.

2. The electrical contactor assembly of claim 1, further comprising:
a panel insulator interposed between the electrical bus bar and the liquid cooled heat sink, the panel insulator being constructed from a thermally conductive and electrically insulating material.

3. The electrical contactor assembly of claim 1, wherein:
the liquid cooled heat sink is composed of a plurality of parallel coolant flow channels.

4. The electrical contactor assembly of claim 1, wherein:
the contactor assembly includes a plurality of posts, the second end of each of the plurality of posts being thermally connected to liquid cooled heat sink through the electrical bus bar.

5. The electrical contactor assembly of claim 1, wherein:
the panel is a printed wire board having a plurality of conductive element embedded in one or more layers of the panel.

6. The electrical contactor assembly of claim 1, further comprising:
a structural support configured to mechanically fasten the at least one post to the panel.

7. An electrical panel box assembly comprising:
a plurality of electrical contactors;
a plurality of electrical bus bars being constructed from a thermally conductive material;
a single panel being constructed from a thermally conductive material;
a plurality of posts protruding through the panel and in contact with the plurality of electrical bus bars, each of the plurality of posts being constructed from an electrically and thermally conductive material, wherein a first end of each of the plurality of posts is configured to electrically and thermally connect to an electrical contactor; and
a liquid cooled heat sink thermally connected to a second end of each of the plurality of posts through the electrical bus bar, wherein the liquid cooled heat sink in operation circulates liquid coolant through the liquid cooled heat sink to absorb heat,
wherein the liquid cooled heat sink is interposed between the panel and each of the plurality of electrical bus bars, and
wherein the liquid cooled heat sink is thermally connected to the panel and each of the plurality of electrical bus bars.

8. The electrical panel box assembly of claim 7, further comprising:
a plurality of panel insulators interposed between each electrical bus bar and the liquid cooled heat sink, the panel insulator being constructed from a thermally conductive and electrically insulating material.

9. The electrical panel box assembly of claim 7, wherein:
the liquid cooled heat sink is composed of a plurality of parallel coolant flow channels.

10. The electrical panel box assembly of claim 7, wherein:
the panel is a printed wire board having a plurality of conductive element embedded in one or more layers of the panel.

11. The electrical panel box assembly of claim 7, further comprising:
a plurality of structural supports configured to mechanically fasten each of the plurality of posts to the panel.

12. A method of assembling an electrical contactor assembly comprising:
obtaining a post having a first end and a second end, the post being constructed from an electrically and thermally conductive material;
operably connecting the first end of the post to an electrical contactor, wherein a first end of the post is configured to electrically and thermally connect to the electrical contactor;
inserting the second end of the post through a hole in a panel being constructed from a thermally conductive material;
operably connecting an electrical bus bar to the second end of the post, the electrical bus bar being constructed from a thermally conductive material; and
thermally connecting a liquid cooled heat sink to the second end of the post through the electrical bus bar, wherein the liquid cooled heat sink in operation circulates liquid coolant through the liquid cooled heat sink to absorb heat
wherein the liquid cooled heat sink is interposed between the panel and the electrical bus bar, and
wherein the liquid cooled heat sink is thermally connected to the panel and the electrical bus bar.

13. The method of claim 12, further comprising:
inserting a panel insulator interposed between the electrical bus bar and the liquid cooled heat sink, the panel insulator being constructed from a thermally conductive and electrically insulating material.

14. The method of claim 12, wherein:
the liquid cooled heat sink is composed of a plurality of parallel coolant flow channels.

15. The method of claim 12, wherein:
the contactor assembly includes a plurality of posts, the second end of each of the plurality of posts being thermally connected to liquid cooled heat sink through the electrical bus bar.

16. The method of claim 12, wherein:
the panel is a printed wire board having a plurality of conductive element embedded in one or more layers of the panel.

17. The method of claim 12, further comprising:
mechanically fastening the post to the panel using a structural support.

\* \* \* \* \*